United States Patent
Wang et al.

(10) Patent No.: US 8,980,753 B2
(45) Date of Patent: Mar. 17, 2015

(54) METAL GATE TRANSISTOR AND METHOD FOR FABRICATING THE SAME

(75) Inventors: Yeng-Peng Wang, Kaohsiung County (TW); Chun-Hsien Lin, Tainan County (TW); Chiu-Hsien Yeh, Tainan (TW); Chin-Cheng Chien, Tainan County (TW); Chan-Lon Yang, Taipei (TW)

(73) Assignee: United Mircroelectronics Corp., Science-Based Industrial Park, Hsin-Chu (TW)

( * ) Notice: Subject to any disclaimer, the term of this patent is extended or adjusted under 35 U.S.C. 154(b) by 641 days.

(21) Appl. No.: 12/886,580

(22) Filed: Sep. 21, 2010

(65) Prior Publication Data
US 2012/0070995 A1    Mar. 22, 2012

(51) Int. Cl.
| | |
|---|---|
| H01L 21/311 | (2006.01) |
| H01L 21/302 | (2006.01) |
| H01L 21/461 | (2006.01) |
| C03C 15/00 | (2006.01) |
| C03C 25/68 | (2006.01) |
| C23F 1/00 | (2006.01) |
| B44C 1/22 | (2006.01) |
| H01L 21/8238 | (2006.01) |

(52) U.S. Cl.
CPC . *H01L 21/823842* (2013.01); *H01L 21/823807* (2013.01); *H01L 21/823814* (2013.01)
USPC .............................. 438/697; 438/736; 216/47

(58) Field of Classification Search
CPC ................... H01L 21/31053; H01L 21/31144; H01L 21/32051
USPC .............................. 438/754, 697, 736; 216/47
See application file for complete search history.

(56) References Cited

U.S. PATENT DOCUMENTS

| | | | | | |
|---|---|---|---|---|---|
| 4,420,365 | A | * | 12/1983 | Lehrer | 438/702 |
| 5,190,792 | A | * | 3/1993 | Blum et al. | 427/560 |
| 5,525,550 | A | * | 6/1996 | Kato | 438/788 |
| 5,976,769 | A | * | 11/1999 | Chapman | 430/316 |
| 7,799,630 | B2 | | 9/2010 | Yu et al. | |
| 2001/0042889 | A1 | * | 11/2001 | Kang | 257/371 |
| 2003/0134474 | A1 | * | 7/2003 | Chan et al. | 438/257 |
| 2008/0042210 | A1 | * | 2/2008 | Hung et al. | 257/369 |
| 2009/0057769 | A1 | * | 3/2009 | Wei et al. | 257/369 |
| 2009/0186458 | A1 | * | 7/2009 | Yu et al. | 438/233 |
| 2010/0087055 | A1 | * | 4/2010 | Lai et al. | 438/585 |
| 2010/0237435 | A1 | * | 9/2010 | Chudzik et al. | 257/380 |

FOREIGN PATENT DOCUMENTS

| | | |
|---|---|---|
| CN | 101499440 A | 8/2009 |
| CN | 101714527 A | 5/2010 |

OTHER PUBLICATIONS

"RCA_Clean"(Wikipedia web page).*

* cited by examiner

*Primary Examiner* — Binh X Tran
*Assistant Examiner* — Thomas Pham
(74) *Attorney, Agent, or Firm* — Winston Hsu; Scott Margo

(57) ABSTRACT

A method for fabricating a metal gate transistor is disclosed. The method includes the steps of: providing a substrate having a first transistor region and a second transistor region; forming a first metal-oxide semiconductor (MOS) transistor on the first transistor region and a second MOS transistor on the second transistor region, in which the first MOS transistor includes a first dummy gate and the second MOS transistor comprises a second dummy gate; forming a patterned hard mask on the second MOS transistor, in which the hard mask includes at least one metal atom; and using the patterned hard mask to remove the first dummy gate of the first MOS transistor.

11 Claims, 5 Drawing Sheets

METAL GATE TRANSISTOR AND METHOD FOR FABRICATING THE SAME

BACKGROUND OF THE INVENTION

1. Field of the Invention

The invention relates to a method for fabrication a transistor, and more particularly, to a method for fabricating a MOS transistor with metal gate.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having high resistance, which causes the polysilicon gate to work under a much lower rate than other metal gates. In order to compensate for slightly lowered rate of performance, a significant amount of silicides is applied during the fabrication of polysilicon processes, such that the performance of the device could be increased to an acceptable level.

Gate electrodes fabricated by polysilicon also causes a depletion effect. In most circumstances, the optimum doping concentration for polysilicon is between about $2 \times 20^{20}/cm^3$ and $3 \times 10^{20}/cm^3$. As most gate electrodes have a doping concentration of at least $5 \times 10^{21}/cm^3$, the limited doping concentration of polysilicon gates often results in a depletion region at the interface between the gate and the gate dielectric layer. This depletion region not only thickens the gate dielectric layer, but also lowers the capacitance of the gate, and ultimately reduces the driving ability of the device.

In order to solve this problem, double work function metal gates are used to replace conventional polysilicon to fabricate gate electrodes for MOS transistors. Conventional approach for fabricating metal gate transistors typically forms a NMOS transistor and a PMOS transistor on a substrate, in which each of the NMOS transistor and the PMOS transistor includes a dummy gate preferably composed of polysilicon. A dry etching and a wet etching process are conducted sequentially to empty the dummy gate of both NMOS and PMOS transistor, or the dummy gate of either one of the transistor, such as the dummy gate of the NMOS or PMOS transistor, and then a metal is filled into the emptied opening for forming a metal gate.

However, polysilicon loss often results as the dummy gate of the transistor is emptied. The polysilicon loss usually forms a recess at the tip of the dummy gate and the recess is unavoidably filled with metal as metal material is deposited into the emptied slot of the original dummy gate. The filled recess ultimately obstructs the removal of polysilicon material in the later process. Hence, how to resolve issue has become and important task in this field.

SUMMARY OF THE INVENTION

It is an objective of the present invention to provide a method for fabricating a transistor with metal gate to resolve the aforementioned issue.

A method for fabricating a metal gate transistor is disclosed. The method includes the steps of: providing a substrate having a first transistor region and a second transistor region; forming a first metal-oxide semiconductor (MOS) transistor on the first transistor region and a second MOS transistor on the second transistor region, in which the first MOS transistor includes a first dummy gate and the second MOS transistor comprises a second dummy gate; forming a patterned hard mask on the second MOS transistor, in which the hard mask includes at least one metal atom; and using the patterned hard mask to remove the first dummy gate of the first MOS transistor.

According to another aspect of the present invention, a method for fabricating a metal gate transistor is disclosed. The method includes the steps of: providing a substrate having a first transistor region and a second transistor region; forming a first metal-oxide semiconductor (MOS) transistor on the first transistor region and a second MOS transistor on the second transistor region, in which the first MOS transistor includes a first dummy gate and the second MOS transistor comprises a second dummy gate; performing a surface treatment on the second dummy gate of the second MOS transistor for forming a hard mask on a surface of the second dummy gate; and using the hard mask for removing the first dummy gate of the first MOS transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
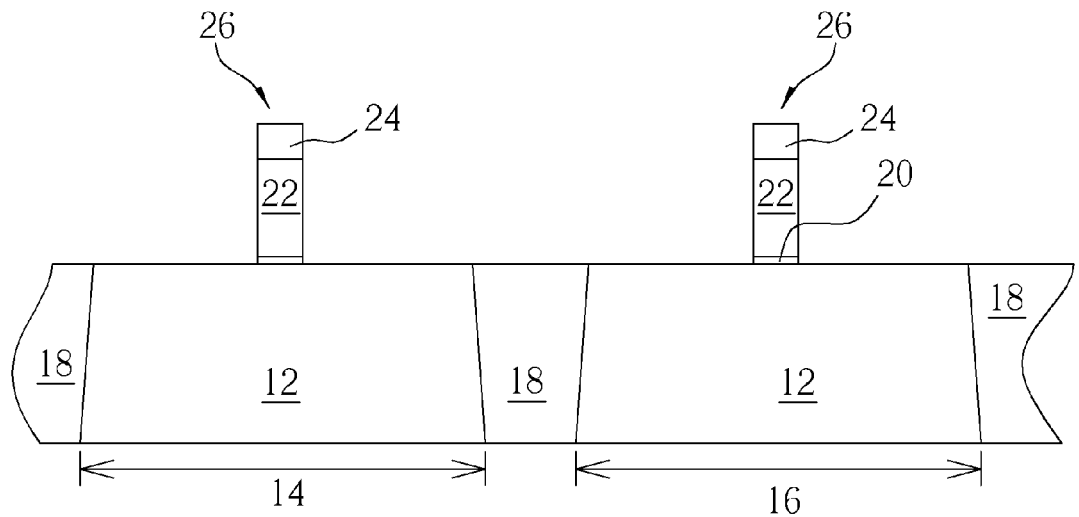
FIGS. 1-6 illustrate a method for fabricating a metal gate transistor according to a preferred embodiment of the present invention.

Referring to FIGS. 1-6, FIGS. 1-6 illustrate a method for fabricating a metal gate transistor according to a preferred embodiment of the present invention. As shown in FIG. 1, a substrate 12, such as a silicon substrate or a silicon-on-insulator substrate is provided. At least a NMOS transistor region 14 and a PMOS transistor region 16 are defined in the substrate 12 and a plurality of shallow trench isolations 18 is formed to isolate the transistor regions 14 and 16.

A gate insulating layer (not shown) composed of dielectric material such as oxides or nitrides is then formed on the surface of the substrate 12. The gate insulating layer could also be composed of pad oxide or a high-k dielectric layer composed of HfSiO, HfSiON, HfO, LaO, LaAlO, ZrO, ZrSiO, or HfZrO. A dummy gate layer, such as a silicon layer including an amorphous silicon layer, a polysilicon layer, a single layer silicon layer with doped silicon layer, or a composite silicon layer with combination of aforementioned silicon layers, (not shown) is deposited on the gate insulating layer, and a cap layer (not shown) is selectively disposed on the polysilicon layer thereafter, in which the polysilicon layer preferably includes a depth between several hundred Angstroms to several thousand Angstroms. In this embodiment, the cap layer is composed of silicon oxide, silicon nitride, or silicon oxynitride, and the polysilicon layer is composed of undoped polysilicon or polysilicon having n+ dopants therein, which are all within the scope of the present invention.

Next, a patterned photoresist (not shown) is formed on the cap layer, and a pattern transfer process is performed by using the patterned photoresist as mask to remove a portion of the cap layer, the polysilicon layer and the gate insulating layer through one or multiple etching processes. After stripping the patterned photoresist, a plurality of dummy gates, such as the silicon gates 26 shown in this embodiment is formed in the NMOS transistor region 14 and the PMOS transistor region 16, in which each silicon gate 26 is composed of a patterned insulating layer 20, a patterned polysilicon layer 22, and a patterned cap layer 24.

Figure 2:
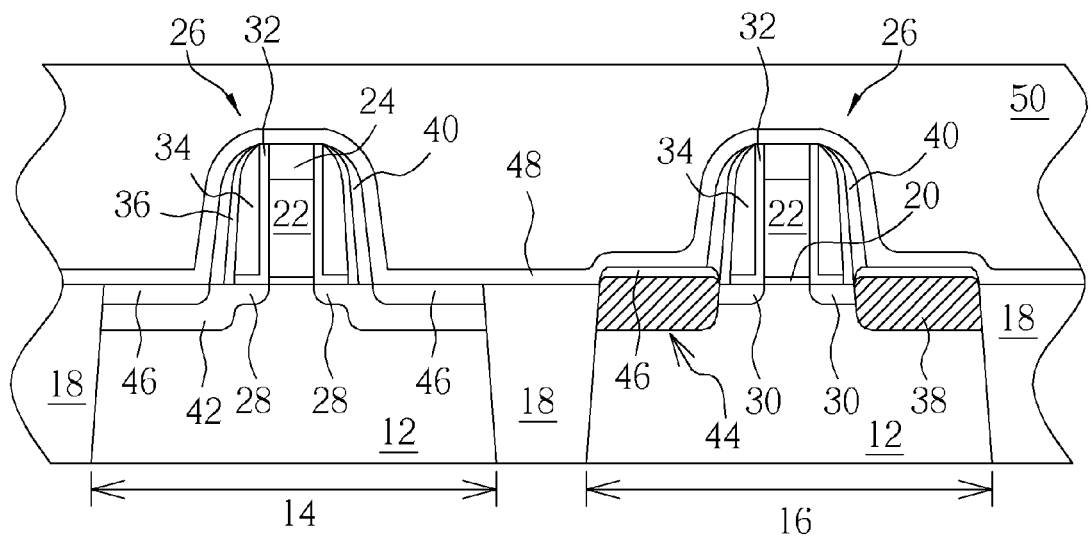

As shown in FIG. 2, a light doping process is conducted in the NMOS transistor region 14 and the PMOS transistor region 16 to form a plurality of lightly doped drains. For instance, a patterned photoresist (not shown) can be disposed on regions outside the NMOS transistor region 14, and an ion implantation is conducted by using the patterned photoresist as mask to implant n-type dopants into the substrate 12 at two sides of the silicon gate 26 of the NMOS transistor region 14 to form a lightly doped drain 28. After stripping the aforementioned photoresist, another patterned photoresist is disposed on regions outside the PMOS transistor region 16, and another ion implantation is conducted by using this patterned photoresist as mask to implant p-type dopants into the substrate 12 at two sides of the silicon gate 26 of the PMOS transistor region 16 for forming a lightly doped drain 30.

A first stage of spacer formation is conducted thereafter. For instance, a silicon oxide layer 32 is formed by chemical vapor deposition at the sidewall surface of the silicon gate 26, and after a silicon nitride layer 34 is deposited, an etching back is utilized to form a spacer composed of silicon nitride 34 and silicon oxide 32 on the sidewall of the silicon gates 26 of the NMOS transistor region 14 and the PMOS transistor region 16.

Next, a passivation layer 36 composed of silicon nitride is deposited over the surface of the silicon nitride layer 34, and a selective epitaxial growth process is conducted to grow a strained silicon in the substrate 12 of the two transistor regions 14, 16. For instance, two recesses could be formed in the substrate 12 at two sides of the silicon gate 26 of the PMOS transistor region 16, and an epitaxial layer 38 composed of silicon germanium is epitaxially grown to substantially fill the two recesses. The epitaxial layer 38 preferably provides a compressive strain to the channel region of the PMOS transistor region 16, thereby increasing the hole mobility of the PMOS transistor. Depending on the demand of the fabrication, an epitaxial layer composed of SiC could also be grown in the substrate 12 at two sides of the gate 26 of the NMOS transistor region 14 to provide a tensile strain to the channel region of the NMOS transistor region 14 and increase the electron mobility of the NMOS transistor.

Next, a second stage of the spacer formation is performed to form a spacer 40 composed of silicon oxide on the sidewall of the passivation layer 36 of the NMOS transistor region 14 and the PMOS transistor region 16.

A heavy doping process is then conducted to form a plurality of source/drain regions in the NMOS transistor region 14. Similar to the aforementioned light doping process, a patterned photoresist (not shown) can be disposed on regions outside the NMOS transistor region 14, and an ion implantation is conducted by using this patterned photoresist as mask to implant n-type dopants into the substrate 12 at two sides of the spacer 40 of the NMOS transistor region 14 to form a source/drain region 42. After stripping the patterned photoresist, another patterned photoresist could be disposed on regions outside the PMOS transistor region 16, and another ion implantation is carried out by using this patterned photoresist as mask to implant p-type dopants into the substrate 12 adjacent to two sides of the spacer 40 of the PMOS transistor region 16 for forming a source/drain region 44.

It should be noted that the aforementioned source/drain regions could be fabricated by using selective epitaxial process, the order of the fabrication process could be rearranged or adjusted according to the demand of the product, and the number of the spacers could also adjusted accordingly. For instance, either one of the silicon oxide layer 32 and the silicon nitride layer 34 formed during the first stage of the main spacer formation could be omitted, and either one of the passivation layer 36 and the spacer 40 could also be omitted. Moreover, the main spacer composed of silicon oxide layer 32 and the silicon nitride layer 34 could be fabricated before or after the formation of the lightly doped source/drains 28, 30; the main spacer composed of silicon oxide layer 32 and the silicon nitride layer 34 and the source/drain region could be formed before removing the spacer and then forming the lightly doped source/drain; the spacers could be formed before an epitaxial layer is formed in the recess of the semiconductor substrate, and the outer most spacer is removed before forming the source/drain region; a recess could be formed in the semiconductor substrate to deposit an epitaxial layer after forming the lightly doped source/drain, and the spacer and source/drain region are formed thereafter. The aforementioned order for fabricating lightly doped source/drains, spacers, and source/drain regions are all within the scope of the present invention.

After the source/drain regions 42 and 44 are formed, a salicide process is performed by first depositing a metal layer (not shown) composed of cobalt, titanium, nickel, platinum, palladium, or molybdenum over the surface of the substrate 12 and the spacer 40, and a laser anneal or rapid thermal annealing process or laser anneal accompanying rapid thermal annealing is conducted thereafter to form a silicide 46 at two sides of the spacer 40. The un-reacted metal layer is removed thereafter. In order to further reduce the resistance of the silicide, another laser anneal or rapid thermal anneal or laser anneal accompanying rapid thermal anneal is usually conducted after removing the un-reacted metal layer.

Next, a silicon nitride layer 48 is deposited on each silicon gate 26, the spacer 40, and the substrate 12. In this embodiment, the silicon nitride layer 48, primarily serving as a stop layer for applying stress to the channel of the transistor in the later planarizing or etching process, preferably includes a depth between several hundred to several thousand Angstroms. Preferably, a silicon nitride having tensile stress could be formed on the NMOS transistor while a silicon nitride having compressive stress could be formed on the PMOS transistor, or a plurality of stress layers capable of adjusting different stress could be formed on the NMOS or PMOS transistor. A buffer layer composed of thin oxide could be formed under the stress layer or between the plurality of stress layers. An interlayer dielectric layer 50 composed of oxides is then deposited on the silicon nitride layer 48 of both NMOS transistor region 14 and PMOS transistor region 16.

Figure 3:
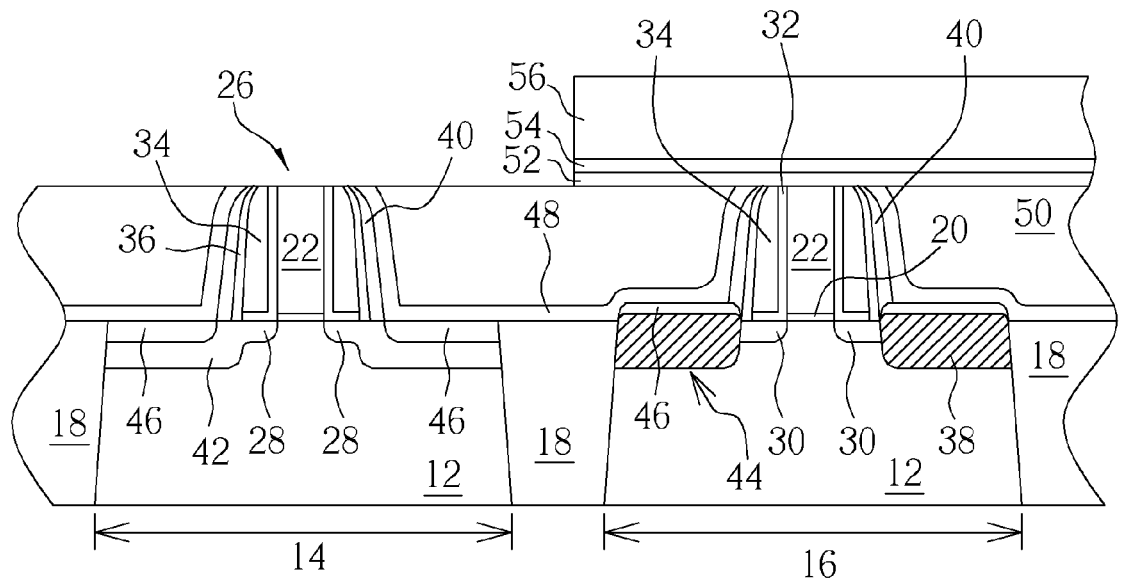

As shown in FIG. 3, a chemical mechanical polishing (CMP) or a dry etching is conducted to remove a portion of the interlayer dielectric layer 50, the silicon nitride layer 48 and the cap layer 24 until exposing the surface of the silicon gate 26 such that the top surface of the silicon gates 26 are substantially even with the surface of the interlayer dielectric layer 50.

Next, a hard mask (not shown) is formed on the interlayer dielectric layer 50 of the PMOS transistor region 16, and a shielding layer (not shown) or anti-reflective layer (not shown) is selectively formed on the surface of the hard mask. In this embodiment, the hard mask preferably includes at least one metal ion, and is selected from TiN, Ti, Ta, TaN, TiAlN, or combination thereof. The shielding layer or anti-reflective layer preferably includes an amorphous carbon (APF) layer or a bottom anti-reflective coating (BARC).

A pattern transfer process is then conducted, such as by first forming a patterned photoresist 56 composed of organic material on the shielding layer of the PMOS transistor region 16, and using the patterned photoresist 56 as mask to etch a portion of the shielding layer and the hard mask for forming a patterned shielding layer 54 and hard mask 52 on surface of the interlayer dielectric layer 50 of the PMOS transistor region 16.

Figure 4:
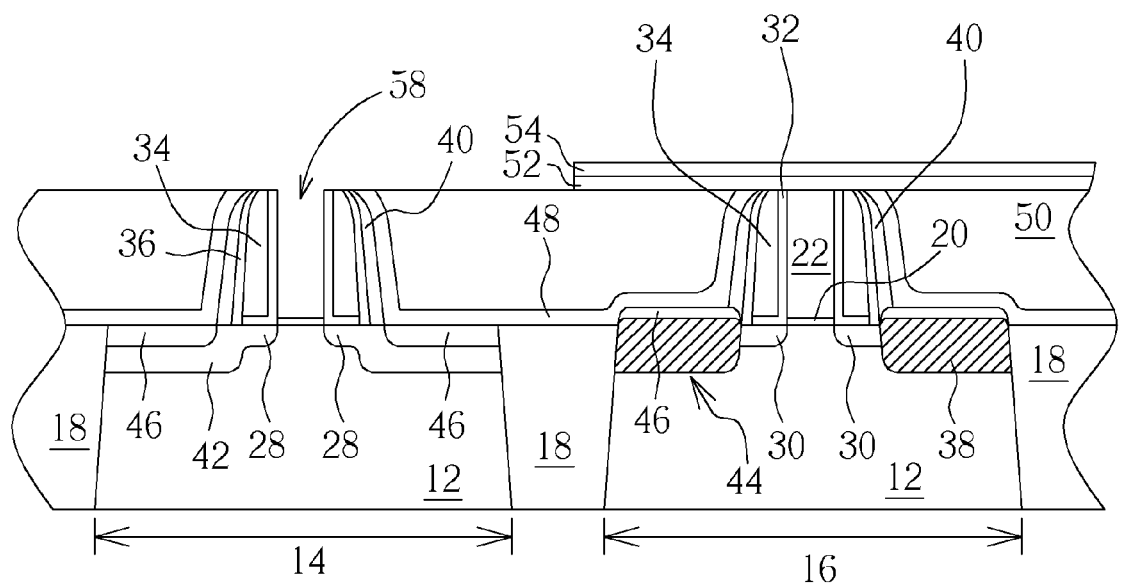

As shown in FIG. 4, a dry etching is performed by using the patterned photoresist 56, the shielding layer 54, and the hard mask 52 as mask to remove the majority of polysilicon from the silicon gate 26 of the NMOS transistor region 14. After stripping the patterned photoresist 56, a wet etching is conducted by using the shielding layer 54 and the hard mask 52 as mask to remove the remaining silicon gate 26 in the NMOS transistor region 14 while clean off residues or native oxides from the exposed surface of the gate insulating layer 20. The wet etching process is preferably conducted by using etchant capable of removing the dummy gate, such as an etchant including ammonium hydroxide ($NH_4OH$) and tetramethylammonium hydroxide (TMAH). This forms an opening 58 in the region where the dummy polysilicon gate of the NMOS transistor region 14 is removed.

Despite the dry etching process uses the patterned photoresist 56, the shielding layer 54, and the hard mask 52 directly as mask to remove the silicon gate 26 of the NMOS transistor region 14, the patterned photoresist 56 could also be stripped before the dry etching process, and then uses the shielding layer 54 and the hard mask 52 as mask for performing the above dry etching and wet etching processes. This order is also within the scope of the present invention. In other words, this approach only uses the pattern photoresist 56 to define the pattern of the shielding layer 54 and the hard mask 52 but not using the patterned photoresist 56 as mask for the dry etching process. Moreover, despite covering the PMOS transistor and then empty the silicon gate of the NMOS transistor, and the dry etching and wet etching are performed sequentially to remove the silicon gate 26 of the NMOS transistor region 14 in the above embodiment, the order, quantity, and variation of these two etching process is not limited thereto. For instance, the NMOS transistor could be covered before empty the silicon gate of the PMOS transistor, and the wet etching could also be conducted before the dry etching process, more than one dry etching or wet etching could be employed, or only the dry etching or the wet etching is used for removing the polysilicon gate. These variations are all within the scope of the present invention.

If the shielding layer 54 is composed of organic material, the shielding layer 54 is preferably removed with the patterned photoresist 56, whereas if the shielding layer 54 is composed of inorganic material, the present invention preferably removes the patterned photoresist 56, and then removes the shielding layer 54 and the hard mask 52 simultaneously.

Figure 5:
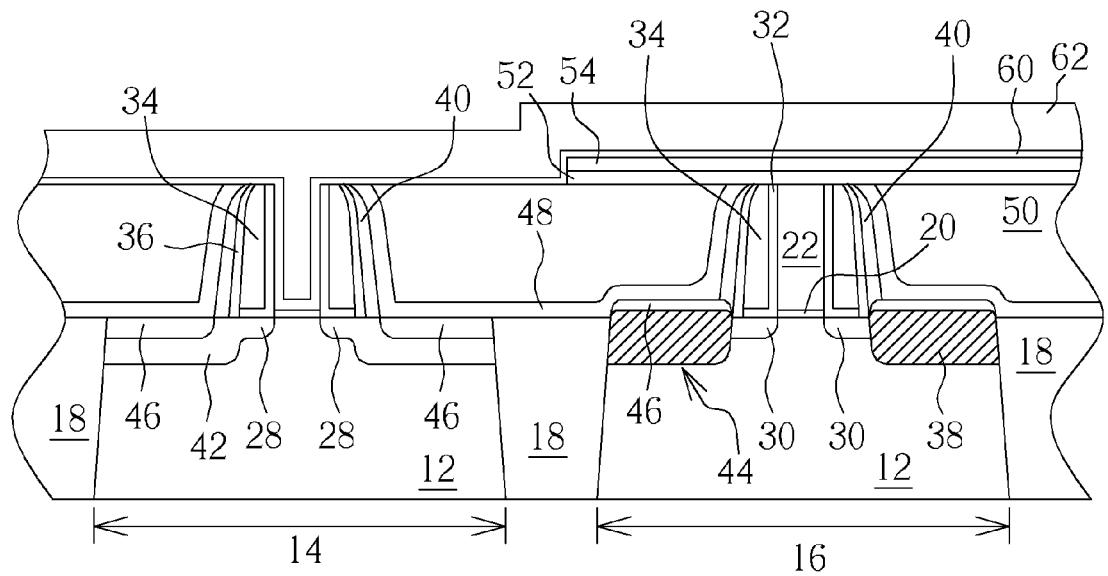

As shown in FIG. 5, a n-type metal layer 60 is deposited on the interlayer dielectric layer 50, the sidewall of the opening 58 and gate insulating layer 20 of the NMOS transistor region 14, and the shielding layer 54 and hard mask 52 of the PMOS transistor region 16. The n-type metal layer 60 is preferably selected from TiN, TaC, TaN, TaSiN, Aluminum, or combination thereof.

A conductive layer 62 composed of low resistance material is then disposed on the n-type metal layer 60 and filled into the opening 58. In this embodiment, the conductive layer 62 is preferably selected from a group consisting of aluminum, tungsten, TiAl alloy, or cobalt tungsten phosphide (CoWP).

Figure 6:
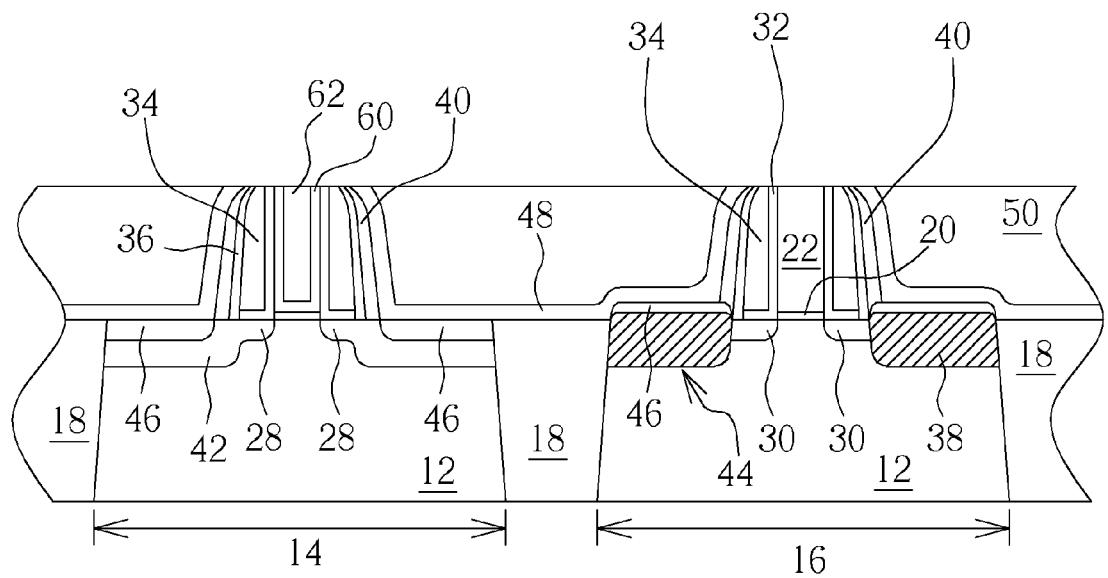

Next, as shown in FIG. 6, another CMP process is performed to partially remove the conductive layer 62 and n-type metal layer 60 disposed on the interlayer dielectric layer 50 and the shielding layer 54 and hard mask 52 disposed on the PMOS transistor region 16 for forming a transistor with metal gate in the NMOS transistor region 14.

Thereafter, the fabrication conducted through FIGS. 3-6 could be employed to form a patterned hard mask, patterned shielding layer, and patterned photoresist on the NMOS transistor region 14, conduct a dry etching a wet etching process by using these three elements as mask to remove the dummy polysilicon gate of the PMOS transistor region 16, and fill a p-type metal layer and conductive layer in the opening where the dummy polysilicon gate is removed. As these steps are similar to the aforementioned steps for removing the dummy polysilicon gate in the NMOS transistor region 14, the details of which are not explained herein for the sake of brevity.

It should also be noted that as a transistor with metal gate is formed on the NMOS transistor region 14, the dry etching and wet etching processes performed in FIGS. 3-4 could also be carried out by using the metal gate of the NMOS transistor region 14 as mask directly without forming any shielding layer or hard mask for removing the polysilicon gate of the PMOS transistor region 16, which is also within the scope of the present invention.

In addition to the above embodiment of using shielding layer 54 and hard mask 52 to remove the dummy gate, another approach could be employed by performing a surface treatment on the surface of the polysilicon gate for forming a protective hard mask. Referring to FIGS. 7-10, FIGS. 7-10 are perspective views illustrating a method for fabricating a metal gate transistor according to an embodiment of the present invention.

Figure 7:
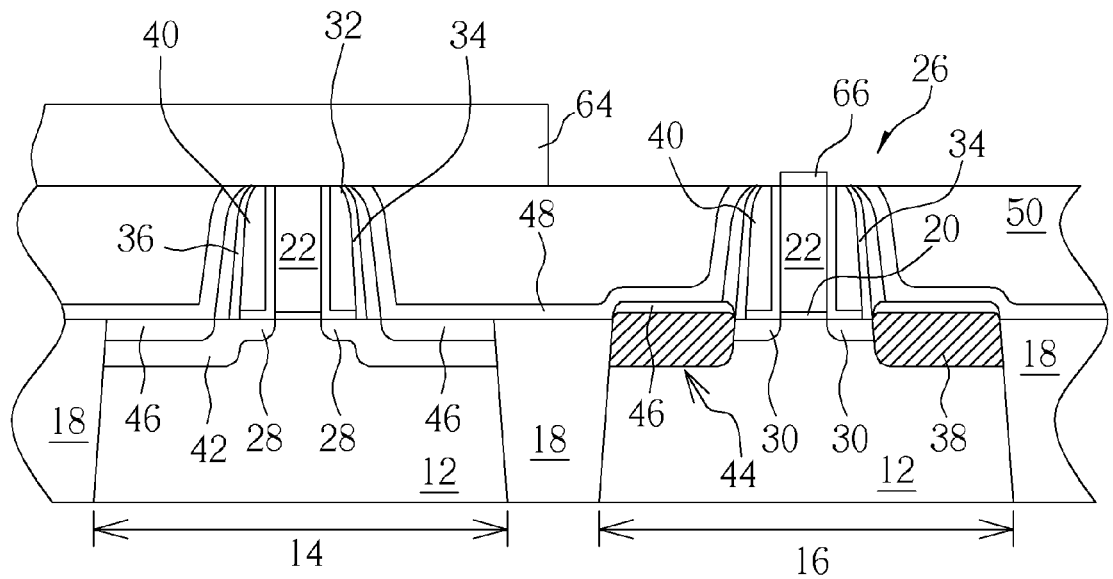
FIGS. 7-10 illustrate a method for fabricating a metal gate transistor according to an embodiment of the present invention.

First, the fabrication conducted in FIGS. 1-2 is carried out to form the interlayer dielectric layer 50 on the NMOS transistor region 14 and the PMOS transistor region 16, and as shown in FIG. 7, a CMP process or a dry etching is performed to partially remove the interlayer dielectric layer 50, the silicon nitride layer 48, and the cap layer 24 until reaching the surface of the silicon gates 26 such that the top surface of the silicon gates 26 are substantially even with the surface of the interlayer dielectric layer 50.

Next, a patterned photoresist 64 is formed on the NMOS transistor region 14, and a surface treatment is performed on the silicon gate 26 of the PMOS transistor region 16 to form a hard mask 66. In this embodiment, the surface treatment could be an ion implantation process, an oxidation process or a nitridation process, in which the oxidation process and the nitridation process could further be achieved by dry plasma treatment, thermal treatment, or wet chemical treatment. If the surface treatment were to be an ion implantation process, boron ions could be implanted to alter the low etching ratio property of the silicon gate surface; and if the surface treatment were to be an oxidation process, the hard mask formed on the polysilicon gate surface is preferably to be a silicon oxide hard mask. If the surface treatment were to be a nitridation process, the hard mask formed on the polysilicon gate is preferably to be a silicon nitride hard mask.

Figure 8:
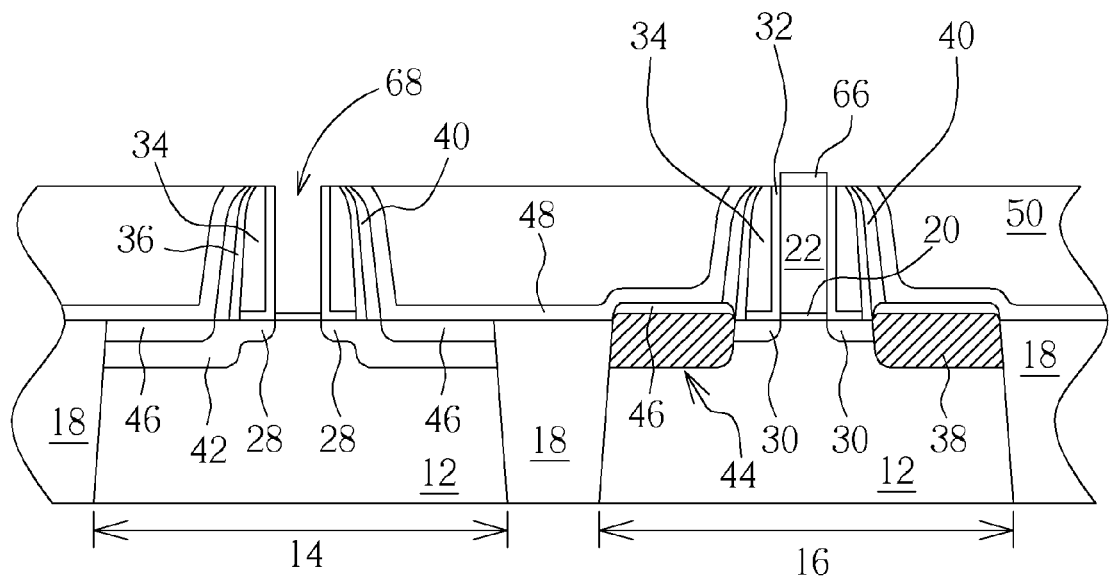

Next, as shown in FIG. 8, after stripping the patterned photoresist 64 from the NMOS transistor region 14, a dry etching process is conducted by using the hard mask 66 as mask to remove majority of the polysilicon gate from the NMOS transistor region 14. A wet etching process is followed thereafter by using etchant capable of removing the dummy gate, such as NH$_4$OH or TMAH to remove the remaining polysilicon gate for forming an opening 68. As the wet etching process etches away the remaining polysilicon gate, the hard mask 66 of the PMOS transistor region 16 is consumed entirely.

Figure 9:
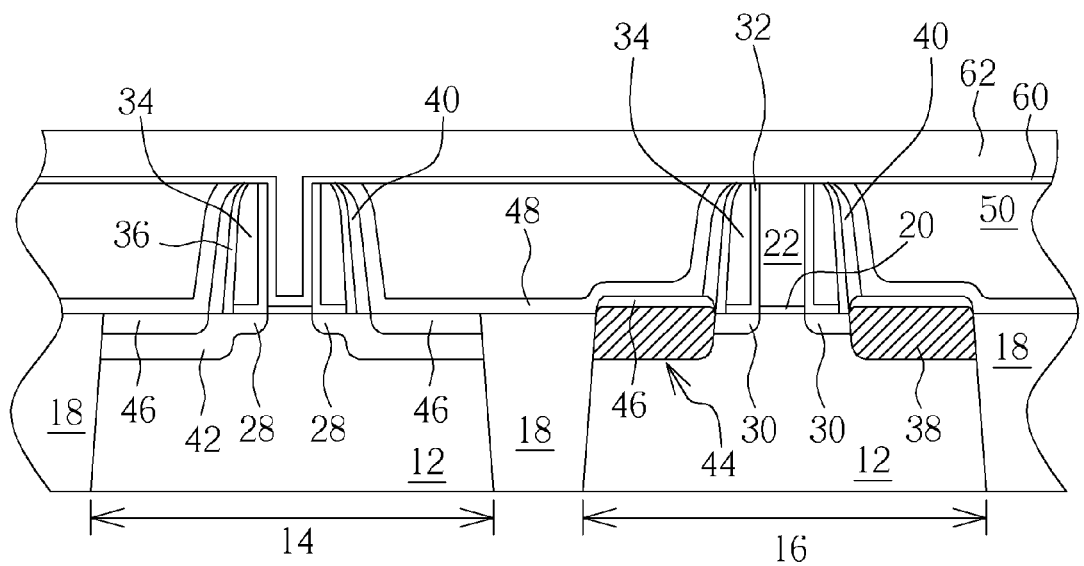

Next, as shown in FIG. 9, a n-type metal layer 60 is deposited on the interlayer dielectric layer 50, the sidewall of the opening 68 and gate insulating layer 20 of the NMOS transistor region 14, and a conductive layer 62 composed of low resistance material is then disposed on the n-type metal layer 60 and filled into the opening 68.

Figure 10:
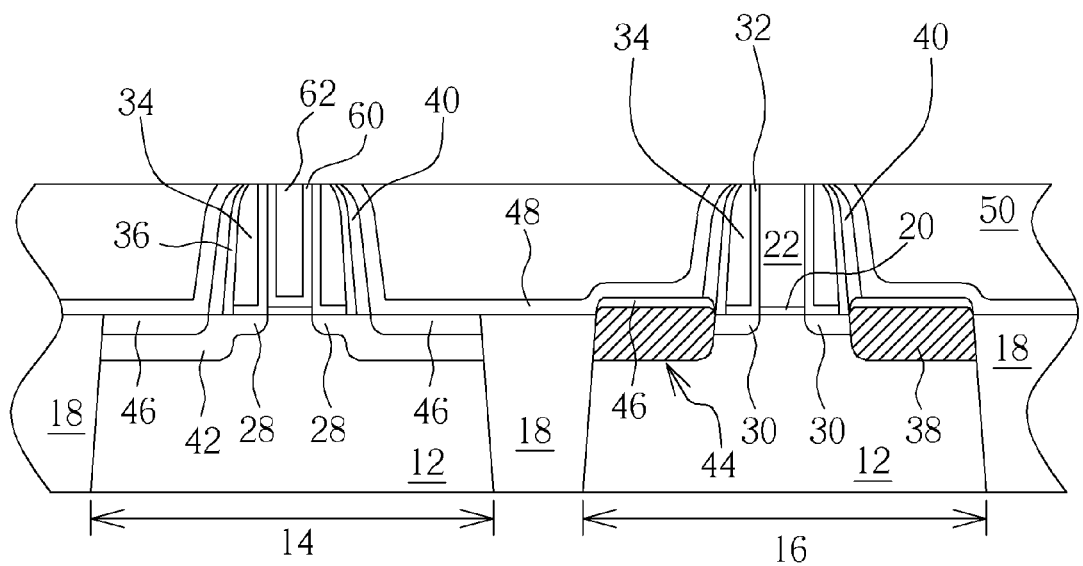

Next, as shown in FIG. 10, a CMP process is performed to partially remove the conductive layer 62 and n-type metal layer 60 disposed on the interlayer dielectric layer 50 for forming a transistor with metal gate in the NMOS transistor region 14.

Thereafter, the fabrication conducted through FIGS. 7-8 could be employed to form a hard mask in the NMOS transistor region through surface treatment, conduct a dry etching a wet etching process by using the hard mask as mask to remove the dummy polysilicon gate of the PMOS transistor region 16, and fill a p-type metal layer and conductive layer in the opening where the dummy polysilicon gate is removed. As these steps are similar to the aforementioned steps for removing the dummy polysilicon gate in the NMOS transistor region 14, the details of which are not explained herein for the sake of brevity.

Overall, the present invention first forms a NMOS transistor and a PMOS transistor on a substrate, in which each of the NMOS transistor and the PMOS transistor includes a dummy polysilicon gate. A hard mask is then formed on either one of the transistor, such as the PMOS transistor, and the dummy polysilicon gate of the NMOS transistor is then removed by using the hard mask as mask. As the PMOS transistor is shielded by the hard mask, the dummy polysilicon gate of the PMOS transistor is protected as the polysilicon gate of the NMOS transistor is removed by dry etching and wet etching processes. This prevents polysilicon loss from the tip of the polysilicon gate and also prevents the emptied tip of the polysilicon gate to be filled with metal in the later process.

Those skilled in the art will readily observe that numerous modifications and alterations of the device and method may be made while retaining the teachings of the invention.

What is claimed is:

1. A method for fabricating a metal gate transistor, comprising:
    providing a substrate having a first transistor region and a second transistor region;
    forming a first metal-oxide semiconductor (MOS) transistor on the first transistor region and a second MOS transistor on the second transistor region, wherein the first MOS transistor comprises a first dummy gate and the second MOS transistor comprises a second dummy gate, wherein each of the first dummy gate and the second dummy gate comprises a patterned insulating layer, a patterned gate layer, and a patterned cap layer;
    forming an interlayer dielectric layer (ILD layer) on the first dummy gate and the second dummy gate;
    after forming the ILD layer on the first dummy gate and the second dummy gate, removing part of the ILD layer and the patterned cap layer of the first dummy gate and the second dummy gate such that the top surfaces of the ILD layer and the patterned gate layer form a substantial planar surface;
    after removing part of the ILD layer and the patterned cap layer of the first dummy gate and the second dummy gate, forming a patterned resist on the first dummy gate in the first transistor region and then performing a surface treatment for forming a hard mask on the patterned gate layer of the second dummy gate; and
    after forming the hard mask on the patterned gate layer of the second dummy gate, using the hard mask for removing the patterned gate layer of the first dummy gate of the first MOS transistor.

2. The method of claim 1, wherein the surface treatment comprises an oxidation process and the hard mask comprises a silicon oxide hard mask.

3. The method of claim 2, further comprising using a dry plasma treatment for performing the oxidation process.

4. The method of claim 2, further comprising using a thermal treatment for performing the oxidation process.

5. The method of claim 2, further comprising using a wet chemical treatment for performing the oxidation process.

6. The method of claim 1, wherein the surface treatment comprises a nitridation process and the hard mask comprises a silicon nitride hard mask.

7. The method of claim 6, further comprising using a dry plasma treatment for performing the nitridation process.

8. The method of claim 6, further comprising using a thermal treatment for performing the nitridation process.

9. The method of claim 6, further comprising using a wet chemical treatment for performing the nitridation process.

10. The method of claim 1, wherein the surface treatment comprises an ion implantation process.

11. The method of claim 10, wherein the ion implantation process comprises implanting boron ions for altering the low etching ratio property of the second dummy gate surface.

* * * * *